US012793807B2

(12) United States Patent
Hu et al.

(10) Patent No.: US 12,793,807 B2
(45) Date of Patent: Nov. 10, 2026

(54) MIXED-MODE VIRTUAL BLOCK GENERATION

(71) Applicant: Micron Technology, Inc., Boise, ID (US)

(72) Inventors: Guang Hu, Mountain View, CA (US); Xiangang Luo, Fremont, CA (US); Jianmin Huang, San Carlos, CA (US)

(73) Assignee: Micron Technology, Inc., Boise, ID (US)

( * ) Notice: Subject to any disclaimer, the term of this patent is extended or adjusted under 35 U.S.C. 154(b) by 150 days.

(21) Appl. No.: 18/788,730

(22) Filed: Jul. 30, 2024

(65) Prior Publication Data

US 2025/0104799 A1 Mar. 27, 2025

Related U.S. Application Data

(60) Provisional application No. 63/540,232, filed on Sep. 25, 2023.

(51) Int. Cl.
*G11C 29/00* (2006.01)

(52) U.S. Cl.
CPC .......... *G11C 29/886* (2013.01); *G11C 29/765* (2013.01)

(58) Field of Classification Search
CPC ............................ G11C 29/886; G11C 29/765
USPC .................................................... 365/185.09
See application file for complete search history.

(56) References Cited

U.S. PATENT DOCUMENTS 9,396,103 B2 7/2016 Sinclair et al.
10,540,274 B2 1/2020 Szubbocsev
10,949,123 B2 3/2021 Parker
11,061,768 B1 7/2021 Alrod et al.
12,423,227 B2 * 9/2025 Xu ..................... G06F 12/0246
(Continued)

FOREIGN PATENT DOCUMENTS

CN 114398010 A 4/2022
TW 201122812 A 7/2011
(Continued)

OTHER PUBLICATIONS

"International Application Serial No. PCT/US2024/011443, International Search Report mailed May 3, 2024", 3 pgs.
(Continued)

*Primary Examiner* — Ly D Pham
(74) *Attorney, Agent, or Firm* — Schwegman Lundberg & Woessner, P.A.

(57) ABSTRACT

Aspects of the present disclosure configure a memory sub-system controller to generate virtual blocks using partial good blocks or portions of full blocks. The controller identifies a region of a set of memory components comprising a plurality of planes across a plurality of decks. The controller determines that a first memory block within a first deck associated with a first plane of the plurality of planes is a first partial good block (PGB), the first PGB including a portions categorized as being defective and portions categorized as being non-defective. The controller determines that a second memory block associated with a second plane is a full block (FB), the FB being categorized as non-defective. The controller generates a virtual block using the first PGB of the first memory block associated with the first plane and a portion of the FB of the second memory block associated with the second plane.

20 Claims, 6 Drawing Sheets

(56) References Cited

U.S. PATENT DOCUMENTS

| | | | |
|---|---|---|---|
| 2010/0082888 | A1 | 4/2010 | Mitsunaga et al. |
| 2011/0209028 | A1 | 8/2011 | Post et al. |
| 2012/0096217 | A1 | 4/2012 | Son et al. |
| 2012/0173797 | A1 | 7/2012 | Shen |
| 2013/0336059 | A1 | 12/2013 | Lee et al. |
| 2015/0187442 | A1 | 7/2015 | Sivasankaran et al. |
| 2015/0378884 | A1 | 12/2015 | Nemazie et al. |
| 2016/0266955 | A1 | 9/2016 | Takeda et al. |
| 2017/0090762 | A1 | 3/2017 | Ea et al. |
| 2017/0286286 | A1 | 10/2017 | Szubbocsev |
| 2018/0129600 | A1 | 5/2018 | Ishiyama et al. |
| 2018/0217892 | A1 | 8/2018 | Syu et al. |
| 2018/0342304 | A1 | 11/2018 | Dunga et al. |
| 2018/0357160 | A1 | 12/2018 | Gorobets et al. |
| 2018/0373431 | A1 | 12/2018 | Kathawala et al. |
| 2019/0205043 | A1 | 7/2019 | Huang et al. |
| 2019/0304562 | A1 | 10/2019 | Cai et al. |
| 2020/0042201 | A1 | 2/2020 | Huang et al. |
| 2021/0365200 | A1 | 11/2021 | Alwala |
| 2022/0066894 | A1 | 3/2022 | Namala et al. |
| 2022/0199189 | A1 | 6/2022 | Namala et al. |
| 2022/0413699 | A1 | 12/2022 | Luo et al. |
| 2024/0053911 | A1* | 2/2024 | He ........................ G06F 3/0631 |
| 2024/0256444 | A1 | 8/2024 | Xu et al. |

FOREIGN PATENT DOCUMENTS

| | | | |
|---|---|---|---|
| WO | WO-2024158577 | A1 | 8/2024 |
| WO | WO-2025071756 | A1 | 4/2025 |

OTHER PUBLICATIONS

"International Application Serial No. PCT/US2024/011443, Written Opinion mailed May 3, 2024", 3 pgs.

"International Application Serial No. PCT/US2024/040175, International Search Report mailed Nov. 11, 2024", 4 pgs.

"International Application Serial No. PCT/US2024/040175, Written Opinion mailed Nov. 11, 2024", 5 pgs.

"Machine Translation of TW-201122812-A", (2011), 27 pages.

"Transgress", Merriam-Webster Online Dictionary, (Dec. 10, 2024), 10 pages.

Yang, Ming-Chang, et al., "Utilization-Aware Self-Tuning Design for TLC Flash Storage Devices", IEEE Transactions on Very Large Scale Integration (VLSI) Systems, IEEE Service Center, Piscataway, NJ, USA, vol. 24, No. 10, (Oct. 1, 2016), 3132-3144.

"European Application Serial No. 24747557.7, Response to Communication pursuant to Rules 1612 and 162 EPC filed Jan. 28, 2026", 9 pages.

* cited by examiner

MIXED-MODE VIRTUAL BLOCK GENERATION

PRIORITY APPLICATION

This application claims the benefit of priority to U.S. Provisional Application Ser. No. 63/540,232, filed Sep. 25, 2023, which is incorporated herein by reference in its entirety.

TECHNICAL FIELD

Examples of the disclosure relate generally to memory sub-systems and, more specifically, to providing adaptive media management for memory components, such as memory dies.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data on the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
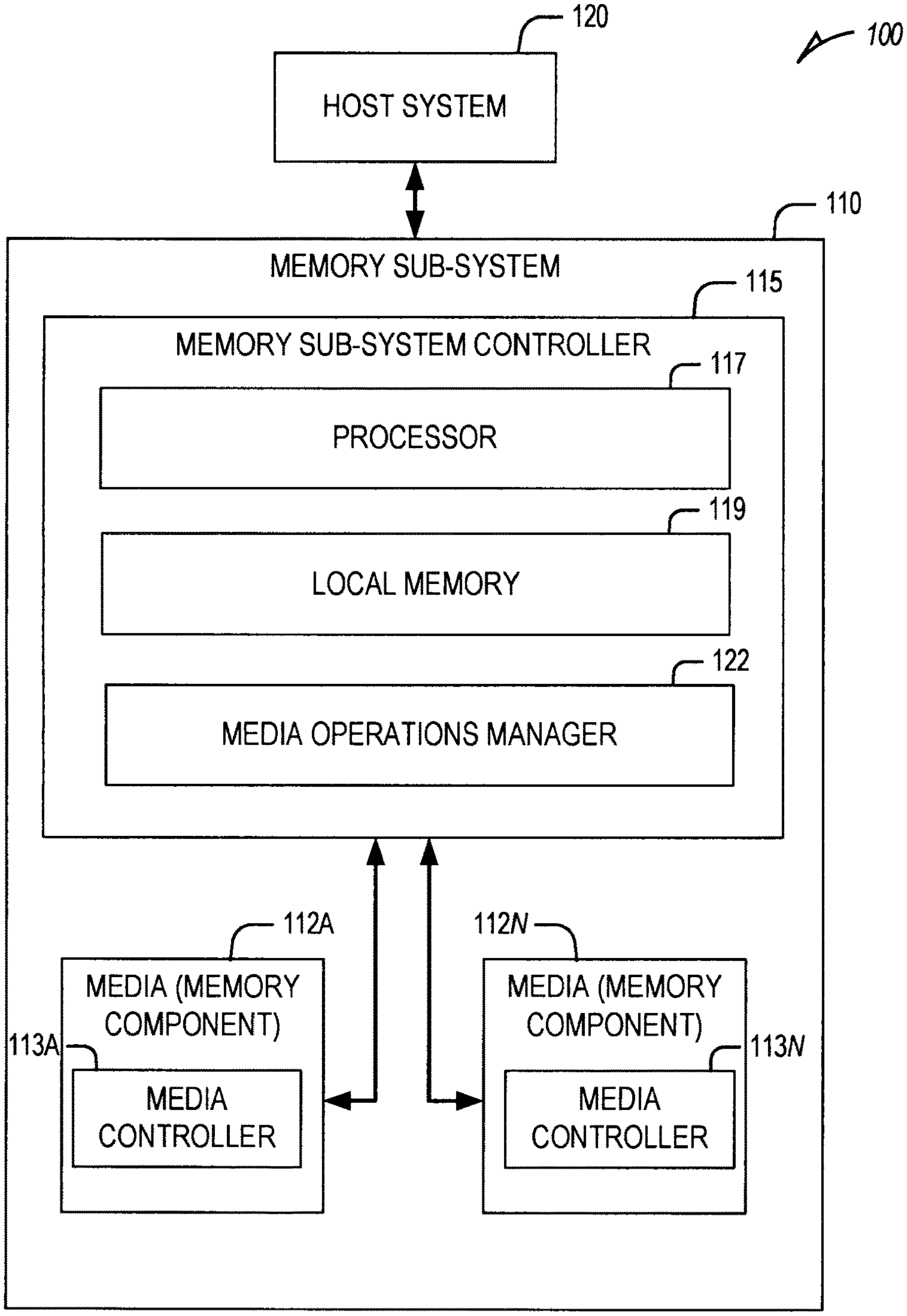
FIG. 1 is a block diagram illustrating an example computing environment including a memory sub-system, in accordance with some examples of the present disclosure.

Aspects of the present disclosure configure a system component, such as a memory sub-system controller, to combine multiple PGBs (also referred to as half good blocks (HGBs)) and portions of FBs to form one or more virtual blocks (VBs). Specifically, the memory controller can generate a VB using various combinations of FBs. One of the FBs used to generate the VB can be made up of a first PGB in a first deck (e.g., an upper deck) of a memory component and a second PGB in a second deck (e.g., a lower deck) of the memory component. Another one of the FBs used to generate the same VB can be made up of some but not all (e.g., less than all) portions of an individual FB within one of the decks (e.g., the first deck) combined with another PGB in another one of the decks (e.g., the second deck) or some but not all portions of another FB in the other one of the decks (e.g., the second deck). In some cases, the virtual block has a size that is smaller than a size of a superblock and is made up of various FBs on multiple planes and decks and PGBs in one or more planes and only one of the multiple decks. This improves the overall efficiency of operating the memory sub-system by utilizing memory blocks even if they include PGBs (e.g., contain some defective word line groups (WGRs)).

A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices (e.g., memory dies) that store data. The host system can send access requests (e.g., write command, read command) to the memory sub-system, such as to store data at the memory sub-system and to read data from the memory sub-system. The data (or set of data) specified by the host is hereinafter referred to as "host data," "application data," or "user data".

The memory sub-system can initiate media management operations, such as a write operation, on host data that is stored on a memory device. For example, firmware of the memory sub-system may re-write previously written host data from a location on a memory device to a new location as part of garbage collection management operations. The data that is re-written, for example as initiated by the firmware, is hereinafter referred to as "garbage collection data". "User data" can include host data and garbage collection data. "System data" hereinafter refers to data that is created and/or maintained by the memory sub-system for performing operations in response to host requests and for media management. Examples of system data include, and are not limited to, system tables (e.g., logical-to-physical address mapping table), data from logging, scratch pad data, etc.

Many different media management operations can be performed on the memory device. For example, the media management operations can include different scan rates, different scan frequencies, different wear leveling, different read disturb management, different near miss error correction (ECC), and/or different dynamic data refresh. Wear leveling ensures that all blocks in a memory component approach their defined erase-cycle budget at the same time, rather than some blocks approaching it earlier. Read disturb management counts all of the read operations to the memory component. If a certain threshold is reached, the surrounding regions are refreshed. Near-miss ECC refreshes all data read by the application that exceeds a configured threshold of errors. Dynamic data-refresh scan reads all data and identifies the error status of all blocks as a background operation. If a certain threshold of errors per block or ECC unit is exceeded in this scan-read, a refresh operation is triggered.

A memory device can be a non-volatile memory device. A non-volatile memory device is a package of one or more dice (or dies). Each die can be comprised of one or more planes. For some types of non-volatile memory devices (e.g., NAND devices), each plane is comprised of a set of physical blocks. For some memory devices, blocks are the smallest area that can be erased. Each block is comprised of a set of pages. Each page is comprised of a set of memory cells, which store bits of data. The memory devices can be raw memory devices (e.g., NAND), which are managed externally, for example, by an external controller. The memory devices can be managed memory devices (e.g., managed NAND), which is a raw memory device combined with a local embedded controller for memory management within the same memory device package.

Typical memory systems leverage VBs, also referred to as superblocks, which are a collection of blocks across multiple memory planes, decks (e.g., upper decks and lower decks), and/or dies. Namely, each superblock can be of equal size and can include a respective collection of blocks across multiple planes, decks, and/or dies. The superblocks, when allocated, allow a controller to simultaneously write data to a large portion of memory spanning multiple blocks (across multiple planes, decks, and/or dies) with a single address. For example, the VBs are usually made up of blocks from an upper deck and a lower deck of the WGRs of the memory components. If any WGR in the upper deck is defective, the conventional systems can utilize the WGRs from the lower deck or vice versa. This can avoid wasting memory resources. In some cases, portions of the blocks can be defective while other portions of the same blocks can be non-defective. Data can be written to the non-defective portions of these blocks. Such blocks are referred to as PGBs.

The PGBs can be on the upper deck and/or the lower deck of the memory devices. Typical memory systems can form virtual blocks by combining multiple PGBs from one deck with multiple PGBs from another deck. For example, the virtual block can be formed by combining a first set of PGBs across a plurality of planes of a first deck of a memory component with a second set of PGBs across the planes of a second deck of the memory component. However, in these systems, the virtual blocks can only be formed using PGBs that are on the same deck (e.g., upper or lower) across a plurality of planes and cannot mix PGBs across different planes of the same deck. If an individual memory component includes a PGB that is on the upper deck of a first plane and a PGB that is on the lower deck of a second plane, such PGBs cannot be combined to form a virtual block. This can reduce the efficiency of generating superblocks because less memory space is available for forming superblocks. This can result in poor or unreliable memory performance.

Aspects of the present disclosure address the above and other deficiencies by providing a memory controller that can combine multiple PGBs with FBs or portions of FBs across planes to form one or more VBs. The memory sub-system controller can generate a VB using various combinations of FBs. One of the FBs used to generate the VB can be made up of a first PGB in a first deck (e.g., an upper deck) of a memory component and a second PGB in a second deck (e.g., a lower deck) of the memory component. Another one of the FBs used to generate the same VB can be made up of some but not all (e.g., less than all) portions of an individual FB within one of the decks (e.g., the first deck) combined with another PGB in another one of the decks (e.g., the second deck) or some but not all portions of another FB in the other one of the decks (e.g., the second deck). In some cases, the VB has a size that is smaller than a size of a superblock and is made up of various FBs on multiple planes and decks and PGBs that are in one or more planes but only one of the multiple decks. This improves the overall efficiency of operating the memory sub-system by utilizing memory blocks even if they contain some defective WGRs.

In some examples, the memory controller identifies a region of the set of memory components, the region including a plurality of planes across a plurality of decks of the set of memory components. The controller determines that a first memory block within a first deck of the plurality of decks of the region associated with a first plane of the plurality of planes is a first PGB. The first PGB includes a first portion categorized as being defective and a second portion categorized as being non-defective. The controller determines that a second memory block within the region associated with a second plane of the plurality of planes is a FB, the FB being categorized as non-defective. The controller generates a virtual block using the first PGB of the first memory block associated with the first plane and a portion of the FB of the second memory block associated with the second plane.

In some examples, the virtual block is generated using less than all portions of the FB. In some examples, the FB is a first FB. In such cases, the controller determines that a third memory block within a second deck of the plurality of decks of the region associated with the second plane is a second FB, the second FB being categorized as non-defective. The controller generates the virtual block by combining the portion of the first FB with another portion of the second FB.

In some examples, the virtual block is generated using all portions of the FB within the first deck. In some examples, the virtual block is generated using all portions of the FB within the second deck. In some examples, the FB is within the first deck or within a second deck of the plurality of decks. In some examples, the first deck is an upper deck or lower deck of the region of the set of memory components.

In some examples, the controller determines that a third memory block within a second deck of the plurality of decks of the region associated with a third plane of the plurality of planes is a second PGB. The second PGB can include one portion categorized as being defective and another portion categorized as being non-defective. In some cases, the controller generates the virtual block using the second PGB of the third memory block associated with the third plane.

In some examples, the controller stores a mapping table that associates logical block addresses of the virtual block with an indication that the virtual block excludes a PGB in another deck and is of a smaller size than a size of a superblock.

In some examples, the controller combines the first PGB and the portion of the FB with a second PGB within a second deck of the plurality of decks of the region associated with the first plane to form the virtual block. In some examples, the controller stores an independent offset for each plane of the plurality of planes and for each deck of the plurality of decks. The independent offset can indicate valid addresses for performing memory operations associated with memory blocks on respective planes of the plurality of planes and respective decks of the plurality of decks.

In some examples, the memory operations include at least one of programming data to the memory blocks, reading data from the memory blocks, or performing garbage collection operations on data stored in the memory blocks. In some cases, the controller generates a superblock based on the virtual block across the first and second planes.

Though various examples are described herein as being implemented with respect to a memory sub-system (e.g., a controller of the memory sub-system), some or all of the portions of an example can be implemented with respect to a host system, such as a software application or an operating system of the host system.

FIG. 1 illustrates an example computing environment 100 including a memory sub-system 110, in accordance with some examples of the present disclosure. The memory sub-system 110 can include media, such as memory components 112A to 112N (also hereinafter referred to as "memory devices"). The memory components 112A to 112N can be volatile memory devices, non-volatile memory devices, or a combination of such. The memory components 112A to 112N can be implemented by individual dies, such that a first memory component 112A can be implemented by a first memory die (or a first collection of memory dies) and a second memory component 112N can be implemented by a second memory die (or a second collection of memory dies).

In some examples, the first memory component 112A, block or page of the first memory component 112A, or group of memory components including the first memory component 112A can be associated with a first reliability (capability) grade, value or measure. The terms "reliability grade," "value" and "measure" are used interchangeably throughout and can have the same meaning. The second memory component 112N or group of memory components including the second memory component 112N can be associated with a second reliability (capability) grade, value or measure. In some examples, each memory component 112A to 112N can store respective configuration data that specifies the respective reliability grade. In some examples, a memory or register can be associated with all of the memory components 112A to 112N, which can store a table that maps different groups, bins or sets of the memory components 112A to 112N to respective reliability grades.

In some examples, a PGB within the first memory component 112A can be grouped with a PGB within the second memory component 112N to form a superblock or VB that has a predetermined, reference or threshold quantity of blocks and WGRs. The PGB within the first memory component 112A can be on the upper deck of the first memory component 112A and the PGB within the second memory component 112N can be on the lower deck of the second memory component 112N. VBs can be addressed collectively using a single address. In such cases, a logical-to-physical address (LTP or L2P) table can store the association between the single address and each of the PGBs of the first memory component 112A and second memory component 112N associated with that single address.

In some examples, some of the WGRs of a given block within the first memory component 112A can have reliability grades that are below a threshold or can be characterized as defective or non-defective. Such blocks can be processed to determine whether a quantity of the WGRs that are non-defective relative to the total quantity of WGRs of the block is greater a minimum or reference percentage threshold. Alternatively, or in addition, such blocks can be processed to determine whether a quantity of the WGRs that are defective relative to the total quantity of WGRs of the block is below a minimum or reference percentage threshold. If the quantity of the WGRs that are non-defective relative to the total quantity of WGRs of the block is greater than a minimum or reference percentage threshold, such a block is marked as a PGB and can be used to form a VB. A memory or table can be generated to list the PGBs and their respective WGRs that are defective or non-defective.

In some examples, a VB can be formed by combining a first set of PGBs across a plurality of planes (e.g., four planes P0-P3) of the first memory component 112A with at least a portion of a FB of a second memory component 112N. Specifically, a first group of PGBs on a first subset of planes (e.g., planes P0-P2) on a lower deck of the second memory component 112N can be combined with a portion of the FB on a remaining plane of the plurality of planes (e.g., plane P3) and that is on the lower deck of the second memory component 112N. The first group of PGBs combined with the portion of the FB can be combined with the first set of PGBs of the first memory component 112A to form the VB. In this way, even though the second memory component 112N has PGBs on less than all of its planes, the PGBs and portions of the FBs of the second memory component 112N can be used to generate the VB with the first memory component 112A.

In some examples, a VB can be formed by combining a first set of PGBs across a plurality of planes (e.g., four planes P0-P3) of the first memory component 112A with at least a portion of a FB of a second memory component 112N. Specifically, a first group of PGBs on a first subset of planes (e.g., planes P0-P2) on an upper deck of the second memory component 112N can be combined with a portion of the FB on a remaining plane of the plurality of planes (e.g., plane P3) and that is on the upper deck of the second memory component 112N. The first group of PGBs combined with the portion of the FB can be combined with the first set of PGBs of the first memory component 112A to form the VB.

In some examples, a VB can be formed by combining a first set of PGBs across a plurality of planes (e.g., four planes P0-P3) of the first memory component 112A with at least a portion of multiple FBs of a second memory component 112N. Specifically, a first group of PGBs on a second subset of planes (e.g., planes P0-P1) on a lower deck of the second memory component 112N can be combined with a portion of a first FB on a first remaining plane of the plurality of planes (e.g., plane P2) and that is on the lower deck of the second memory component 112N. Also, the first group of PGBs on the second subset of planes (e.g., planes P0-P1) on the lower deck of the second memory component 112N and the portion of the first FB can be combined with a portion of a second FB on a second remaining plane of the plurality of planes (e.g., plane P3) and that is on the lower deck of the second memory component 112N. The first group of PGBs combined with the portions of the first and second FBs can be combined with the first set of PGBs of the first memory component 112A to form the VB.

In some examples, a VB can be formed by combining a first set of PGBs across a first subset of a plurality of planes (e.g., planes P0-P1) of the first memory component 112A with at least a portion of multiple PGBs of the second memory component 112N and with other FBs of the first memory component 112A across a second subset of the plurality of planes (e.g., planes P2-P3). Specifically, a first group of PGBs on the first subset of planes (e.g., planes P0-P1) on a lower deck of the second memory component 112N can be combined with the first set of PGBs across the first subset of planes of the first memory component 112A. The VB can also be formed by combining other FBs (e.g., a first FB on a first remaining plane, such as plane P2 and a second FB on a second remaining plane, such as plane P3 of the first or second memory component 112A or 112N) with the combined first group of PGBs and first set of PGBs.

In some examples, the VB that is formed can be of a size that is smaller than a superblock. In such cases, the VB can be formed by combining multiple FBs across a first set of planes of the first memory component 112A with one or more PGBs on a second set of planes of the first memory component 112A. In such cases, the PGBs can be on any deck (upper or lower) of the first memory component 112A and can be combined with the FBs on the other planes to form the VB that is smaller than other superblocks. In these circumstances, a table can be maintained that identifies the logical block addresses (LBAs) and/or addresses of such VBs that are of smaller sizes than superblocks. The table can specify which plane of the VB includes the PGB on only one deck (e.g., the plane of the VB that makes the VB smaller than the superblock because the PGB from one deck is not combined with the PGB from another deck).

In some examples, the memory sub-system 110 is a storage system. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to a memory system. The memory system can include one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, a compute express link (CXL), a universal serial bus (USB) interface, a Fibre Channel interface, a Serial Attached SCSI (SAS) interface, etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe or CXL interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative- and (NAND)—type flash memory. Each of the memory components 112A to 112N can include one or more arrays of memory cells such as single-level cells (SLCs) or multi-level cells (MLCs) (e.g., TLCs or QLCs). In some embodiments, a particular memory component 112 can include both an SLC portion and an MLC portion of memory cells. Each of the memory cells can store one or more bits of data (e.g., blocks) used by the host system 120. Although non-volatile memory components such as NAND-type flash memory are described, the memory components 112A to 112N can be based on any other type of memory, such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magnetoresistive random access memory (MRAM), negative-or (NOR) flash memory, electrically erasable programmable read-only memory (EEPROM), and a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write-in-place operation, where a non-volatile memory cell can be programmed without the non-volatile memory cell being previously erased. Furthermore, the memory cells of the memory components 112A to 112N can be grouped as memory pages or blocks that can refer to a unit of the memory component 112 used to store data. For example, a single first row that spans memory components 112A to 112N can correspond to or be grouped as a first superblock and a single second row that spans memory components 112A to 112N can correspond to or be grouped as a second superblock. If the single first row includes all good blocks (e.g., each block in the single first row has a reliability grade above a threshold), the first superblock is a first complete superblock. If the single first row includes some bad blocks (e.g., one or more blocks in the single first row have a reliability grade below a threshold), the first superblock is a first incomplete superblock.

The memory sub-system controller 115 can communicate with the memory components 112A to 112N to perform memory operations such as reading data, writing data, or erasing data at the memory components 112A to 112N and other such operations. The memory sub-system controller 115 can communicate with the memory components 112A to 112N to perform various memory management operations, such as different scan rates, different scan frequencies, different wear leveling, different read disturb management, different near miss ECC operations, and/or different dynamic data refresh.

The memory sub-system controller 115 can include hardware such as one or more integrated circuits and/or discrete components, a buffer memory, or a combination thereof. The memory sub-system controller 115 can be a microcontroller, special-purpose logic circuitry (e.g., a field programmable gate array (FPGA), an application specific integrated circuit (ASIC), etc.), or another suitable processor. The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, and so forth. The local memory 119 can also include read-only memory (ROM) for storing microcode. While the example memory sub-system 110 in FIG. 1 has been illustrated as including the memory sub-system controller 115, in another embodiment of the present disclosure, a memory sub-system 110 may not include a memory sub-system controller 115, and can instead rely upon external control (e.g., provided by an external host, or by a processor 117 or controller separate from the memory sub-system 110).

In general, the memory sub-system controller 115 can receive commands or operations from the host system 120 and can convert the commands or operations into instructions or appropriate commands to achieve the desired access to the memory components 112A to 112N. In some examples, the commands or operations received from the host system 120 can specify configuration data for the memory components 112N to 112N. The configuration data can describe the reliability grades and/or indications of defects in certain WGRs associated with different groups of the memory components 112N to 112N and/or different blocks within each of the memory components 112N to 112N. In some cases, the reliability grades are dynamic and can be updated by the memory sub-system controller 115 in response to determining that certain error rates are reached that transgress an error rate threshold. For example, a non-defective WGR can become a defective WGR if that non-defective WGR starts having error rates that transgress the threshold. In such cases, the configuration data is updated and any VB that includes that now defective WGR is updated with a replacement or spare PGB to maintain performance of the VB above a minimum or reference performance rating.

The memory sub-system controller 115 can be responsible for other memory management operations, such as wear leveling operations, garbage collection operations, error detection and error-correcting code (ECC) operations, encryption operations, caching operations, and address translations. The memory sub-system controller 115 can further include host interface circuitry to communicate with the host system 120 via the physical host interface. The host interface circuitry can convert the commands received from the host system 120 into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM or other temporary storage location or device) and address circuitry (e.g., a row decoder and a column decoder) that can receive an address from the memory sub-system controller 115 and decode the address to access the memory components 112A to 112N.

The memory devices can be raw memory devices (e.g., NAND), which are managed externally, for example, by an external controller (e.g., memory sub-system controller 115). The memory devices can be managed memory devices (e.g., managed NAND), which is a raw memory device combined with a local embedded controller (e.g., local media controllers) for memory management within the same memory device package. Any one of the memory components 112A to 112N can include a media controller (e.g., media controller 113A and media controller 113N) to manage the memory cells of the memory component (e.g., to perform one or more memory management operations), to communicate with the memory sub-system controller 115, and to execute memory requests (e.g., read or write) received from the memory sub-system controller 115.

The memory sub-system controller 115 can include a media operations manager 122. The media operations manager 122 can be configured to combine multiple PGBs and portions of FBs across multiple planes and decks of multiple memory components to form one or more VBs. The memory sub-system controller 115 can access configuration data associated with a set of memory components. The configuration data can include a table that associates different WGRs of blocks of the memory components with indications of whether the WGRs are defective or non-defective. Based on the configuration data, the memory sub-system controller 115 can identify those PGBs that have a reference or minimum quantity or percentage (e.g., 30%) of WGRs that are non-defective. The memory sub-system controller 115 can then combine multiple such PGBs with various portions of FBs to form one or more VBs. This improves the overall efficiency of operating the memory sub-system by utilizing memory blocks even if they contain some defective WGRs. This increases the efficiency of operating memory systems.

In some examples, the memory sub-system controller 115 (e.g., the media operations manager 122) identifies a region of a set of memory components comprising a plurality of planes across a plurality of decks of the set of memory components. The memory sub-system controller 115 determines that a first memory block within a first deck associated with a first plane of the plurality of planes is a first PGB, the first PGB including portions categorized as being defective and portions categorized as being non-defective. The memory sub-system controller 115 determines that a second memory block associated with a second plane is a FB, the FB being categorized as non-defective. The memory sub-system controller 115 generates a virtual block using the first PGB of the first memory block associated with the first plane and a portion of the FB of the second memory block associated with the second plane.

Depending on the example, the media operations manager 122 can comprise logic (e.g., a set of transitory or non-transitory machine instructions, such as firmware) or one or more components that causes the media operations manager 122 to perform operations described herein. The media operations manager 122 can comprise a tangible or non-tangible unit capable of performing operations described herein. Further details with regards to the operations of the media operations manager 122 are described below.

Figure 2:
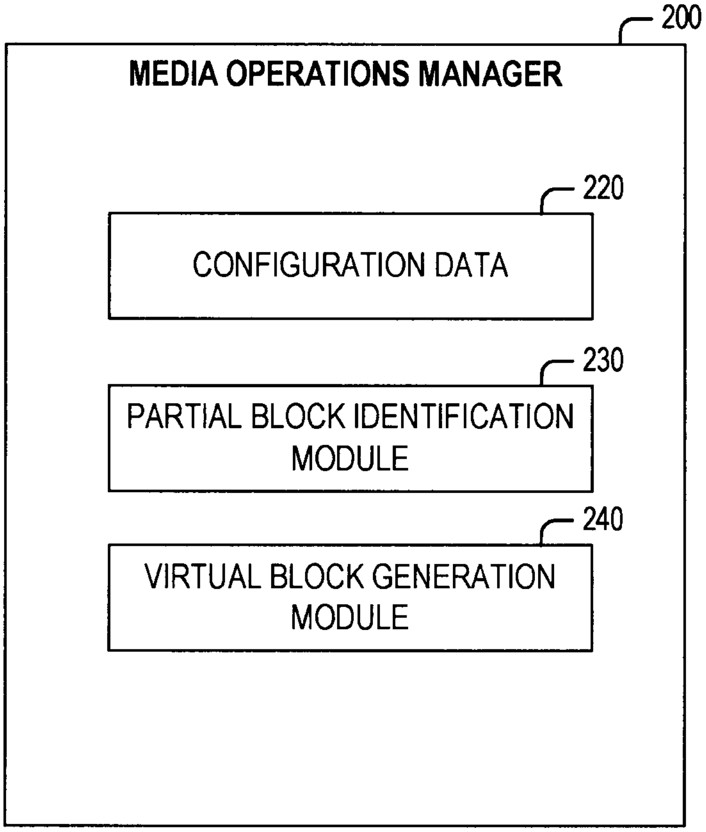
FIG. 2 is a block diagram of an example media operations manager, in accordance with some examples of the present disclosure.

FIG. 2 is a block diagram of an example media operations manager 200, in accordance with some implementations of the present disclosure. The media operations manager 200 can include some or all of the components of the media operations manager 122, shown in FIG. 1. As illustrated, the media operations manager 122 includes configuration data 220, a partial block identification module 230, and a virtual block generation module 240. For some examples, the media operations manager 122 can differ in components or arrangement (e.g., less or more components) from what is illustrated in FIG. 2.

The configuration data 220 accesses and/or stores configuration data associated with the memory components 112A to 112N. In some examples, the configuration data 220 is programmed into the media operations manager 122 during manufacture of the memory sub-system 110. The media operations manager 122 can communicate with the memory components 112A to 112N to obtain the configuration data and store the configuration data 220 locally on the media operations manager 122. In some examples, the media operations manager 122 communicates with the host system 120. The host system 120 receives input from an operator or user that specifies parameters including indications of defects present on different WGRs, different bins, groups, blocks, or sets of the memory components 112A to 112N. The media operations manager 122 receives configuration data from the host system 120 and stores the configuration data in the configuration data 220.

In some examples, the media operations manager 122 performs one or more test operations on different groups or blocks of the memory components 112A to 112N. The test operations are configured to determine and detect which WGRs have recoverable defects (are non-defective) and which WGRs have non-recoverable defects (are defective) of each block of the memory components 112A to 112N. Recoverable defects include at least one of word line (WL) to WL shorts, open WL, a slow to program WL, or a WL that fails to satisfy read bit error rate thresholds. Non-recoverable defects include at least one of word line (WL) to pillar shorts, source-to-gate (SG) shorts, or dummy WL shorts.

Based on a result of the test operations, the media operations manager 122 can store or update the PGB identified in the configuration data 220. In some examples, the media operations manager 122 can periodically or routinely perform the test operations to update which WGRs change from being non-defective to being defective resulting in failure of the PGB. The configuration data 220 can also store a reference or minimum threshold percentage of non-defective WGRs an individual block can have to be usable as a PGB.

In some examples, the partial block identification module 230 accesses the configuration data 220 to generate a list of PGBs. In such cases, the partial block identification module 230 can obtain from the configuration data 220 the list of WGRs and their respective indications of types of defects (e.g., recoverable or non-recoverable). The partial block identification module 230 can determine for an individual block the quantity of WGRs having recoverable defects. The partial block identification module 230 can compute the total quantity of WGRs (having the recoverable and non-recoverable defects) of the individual block. The partial block identification module 230 can compute a ratio or percentage of the quantity of WGRs having recoverable defects to the total quantity of WGRs. The partial block identification module 230 can obtain the reference or minimum threshold percentage of non-defective WGRs an individual block can have to be usable as a PGB from the configuration data 220. The partial block identification module 230 can determine that the ratio or percentage of the quantity of WGRs having recoverable defects to the total quantity of WGRs transgresses the reference or minimum threshold percentage of non-defective WGRs (e.g., 30%). In such cases, the partial block identification module 230 can add the individual block to a list of PGBs by storing an address of the block corresponding to the PGB and the list of WGRs having non-recoverable defects or that are defective. If the ratio or percentage of the quantity of WGRs having recoverable defects to the total quantity of WGRs fails to transgress the reference or minimum threshold percentage, the individual block is discarded and is excluded from the list of PGBs to avoid using the block as a PGB used to form a VB.

The partial block identification module 230 can continue processing all of the blocks of the memory components 112A-112N in a similar manner to compile a list of all PGBs for which a quantity of WGRs that are non-defective relative to a total number of WGRs transgresses a reference or threshold percentage. In some examples, in response to determining that the ratio or percentage of the quantity of WGRs having recoverable defects to the total quantity of WGRs transgresses the reference or minimum threshold percentage of non-defective WGRs (e.g., 30%), the partial block identification module 230 can perform additional reliability tests on the remaining WGRs that are non-defective. The partial block identification module 230 can determine that the remaining WGRs of the individual block pass the additional reliability tests. For example, the partial block identification module 230 can determine that a read bit error rate (RBER) RBER for the WGRs that are non-defective is below a reference RBER. If the remaining WGRs of the individual block pass the additional reliability tests, the PGB is maintained or added to the list of PGBs. If the remaining WGRs of the individual block fail the additional reliability tests, the individual block is discarded and is excluded from the list of PGBs to avoid using the block as a PGB used to form a VB.

After the list of PGBs is generated, the virtual block generation module 240 can access the list of PGBs to form one or more VBs using different groups of PGBs that are in the list and using various FBs on different planes and/or decks of the memory components 112A to 112N. For example, the virtual block generation module 240 can form an individual VB by combining a first set of PGBs across a plurality of planes (e.g., four planes P0-P3) of the first memory component 112A with at least a portion of a FB of a second memory component 112N. Specifically, a first group of PGBs on a first subset of planes (e.g., planes P0-P2) on a lower deck of the second memory component 112N can be combined with a portion of the FB on a remaining plane of the plurality of planes (e.g., plane P3) and that is on the lower deck of the second memory component 112N. The first group of PGBs combined with the portion of the FB can be combined with the first set of PGBs of the first memory component 112A to form the VB.

In some examples, combining of different memory portions or regions can be performed by storing LBAs or block addresses of the memory portions or regions in association with an address of the VB. For example, the virtual block generation module 240 can store an address of a VB. The virtual block generation module 240 can associate with that address the LBAs or block addresses of the first set of PGBs across a plurality of planes (e.g., four planes P0-P3) of the first memory component 112A and the at least a portion of the FB of the second memory component 112N. In this way, when a memory operation is requested to be performed for the VB, the associated LBAs and/or block addresses can be used to access or perform the requested operation on the data.

In some examples, the virtual block generation module 240 forms the individual VB by combining a first set of PGBs across a plurality of planes (e.g., four planes P0-P3) of the first memory component 112A with at least a portion of a FB of a second memory component 112N. Specifically, a first group of PGBs on a first subset of planes (e.g., planes P0-P2) on an upper deck of the second memory component 112N can be combined with a portion of the FB on a remaining plane of the plurality of planes (e.g., plane P3) and that is on the upper deck of the second memory component 112N. The first group of PGBs combined with the portion of the FB can be combined with the first set of PGBs of the first memory component 112A to form the VB.

In some examples, the virtual block generation module 240 forms (generates) the VB by combining a first set of PGBs across a plurality of planes (e.g., four planes P0-P3) of the first memory component 112A with at least a portion of multiple FBs of a second memory component 112N. Specifically, a first group of PGBs on a second subset of planes (e.g., planes P0-P1) on a lower deck of the second memory component 112N can be combined with a portion of a first FB on a first remaining plane of the plurality of planes (e.g., plane P2) and that is on the lower deck of the second memory component 112N. Also, the first group of PGBs on the second subset of planes (e.g., planes P0-P1) on the lower deck of the second memory component 112N and the portion of the first FB can be combined with a portion of a second FB on a second remaining plane of the plurality of planes (e.g., plane P3) and that is on the lower deck of the second memory component 112N. The first group of PGBs combined with the portions of the first and second FBs can be combined with the first set of PGBs of the first memory component 112A to form the VB.

In some examples, the virtual block generation module 240 forms the VB by combining a first set of PGBs across a first subset of a plurality of planes (e.g., planes P0-P1) of the first memory component 112A with at least a portion of multiple PGBs of the second memory component 112N and with other FBs of the first memory component 112A across a second subset of the plurality of planes (e.g., planes P2-P3). Specifically, a first group of PGBs on the first subset of planes (e.g., planes P0-P1) on a lower deck of the second memory component 112N can be combined with the first set of PGBs across the first subset of planes of the first memory component 112A. The VB can also be formed by combining other FBs (e.g., a first FB on a first remaining plane, such as plane P2, and a second FB on a second remaining plane, such as plane P3 of the first or second memory component 112A or 112N) with the combined first group of PGBs and first set of PGBs.

In some examples, the VB that is formed can be of a size that is smaller than a superblock. In such cases, the virtual block generation module 240 forms the VB by combining multiple FBs across a first set of planes of the first memory component 112A with one or more PGBs on a second set of planes of the first memory component 112A. In such cases, the PGBs can be on any deck (upper or lower) of the first memory component 112A and can be combined with the FBs on the other planes to form the VB that is smaller than other superblocks. In these circumstances, a table can be maintained that identifies the logical block addresses (LBAs) and/or addresses of such VBs that are of smaller sizes than superblocks. The table can specify which plane of the VB includes the PGB on only one deck (e.g., the plane of the VB that makes the VB smaller than the superblock because the PGB from one deck is not combined with the PGB from another deck).

The virtual block generation module 240 can maintain independent offsets for each plane of the plurality of planes and for each deck of the plurality of decks of the memory components 112A to 112N. The independent offset can indicate valid addresses for performing memory operations associated with memory blocks on respective planes of the plurality of planes and respective decks of the plurality of decks.

Figure 3:
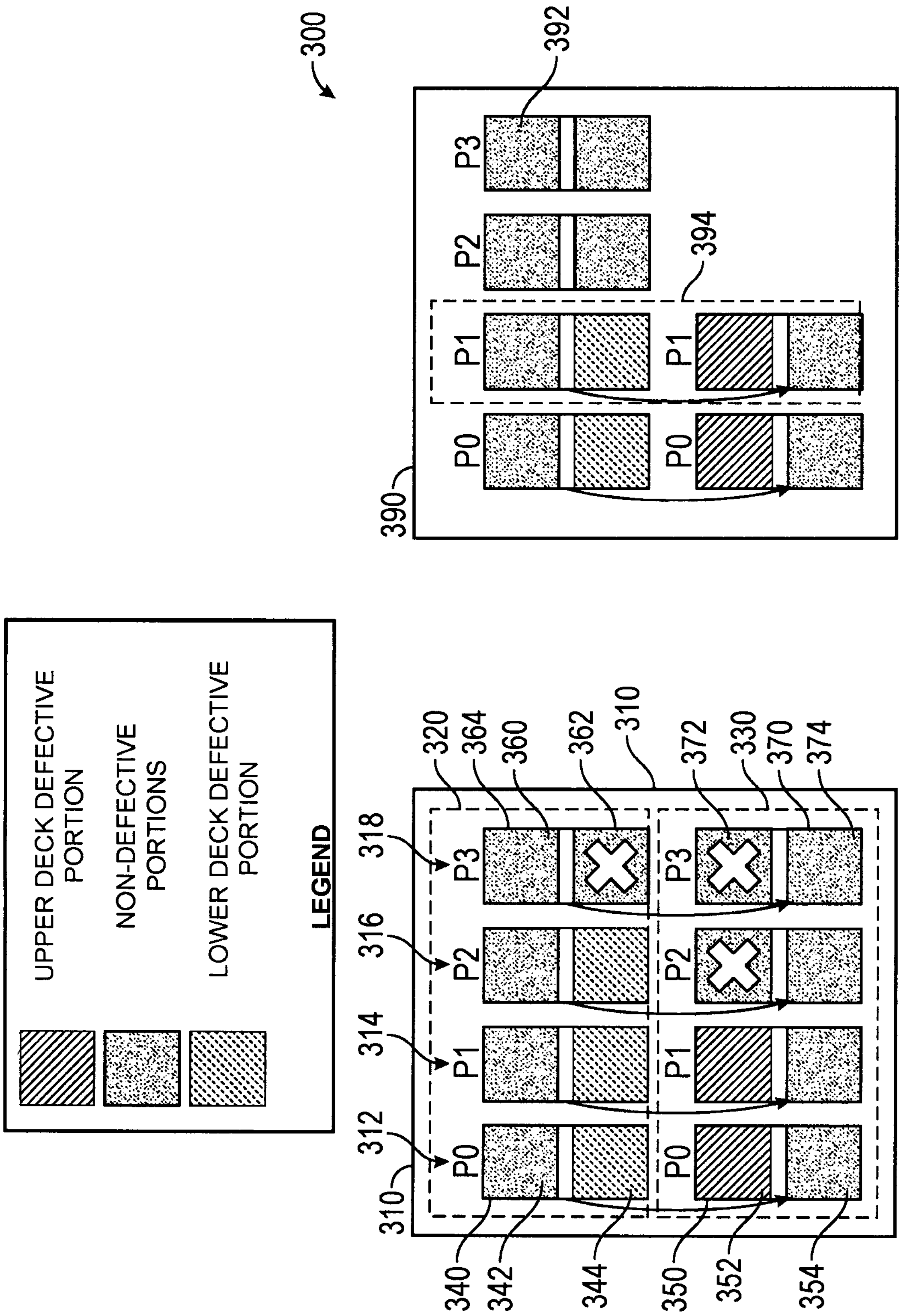
FIGS. 3 and 4 are block diagrams of example virtual blocks made up of partial good blocks (PGBs) and full blocks (FBs), in accordance with some examples of the present disclosure.

FIG. 3 is a block diagram of an example plurality of VBs 300 made up of PGBs and one or more portions of one or more FBs, in accordance with some implementations of the present disclosure. Specifically, a first VB 310 can be formed or generated by the virtual block generation module 240 by combining different PGBs and/or portions of FBs across multiple planes and decks of multiple memory components 112A to 112N. For example, a first memory component 320 can include a plurality of planes 312, 314, 316, and 318 across multiple decks (e.g., an upper deck and a lower deck) and a second memory component 330 can include a plurality of planes 312, 314, 316, and 318 across multiple decks (e.g., an upper deck and a lower deck). The virtual block generation module 240 can determine that the planes 312, 314 and 316 of the first memory component 320 include PGBs 342 on the upper deck. In such cases, the virtual block generation module 240 can determine that the lower decks of planes 312, 314, and 316 include defective portions that cannot be accessed. In such cases, to generate a FB to be used in generating a VB, the virtual block generation module 240 can combine the PGBs 342 of the first memory component 320 with PGBs 354 (and/or portions of FBs) across the same set of planes of another memory component (e.g., the second memory component 112N).

For example, the virtual block generation module 240 can determine that the second memory component 330 includes a block 350 on a first plane 312 that includes a PGB 354 on the lower deck and that includes a defective portion 352 on the upper deck. The virtual block generation module 240 can combine the PGBs 342 of the first plane 312 of the first memory component 320 with the PGB 354 of the second memory component 330 that is on the first plane 312 to form a first FB. Similarly, the virtual block generation module 240 can combine the PGBs 342 of the second plane 314 of the first memory component 320 with a PGB of the second memory component 330 that is on the second plane 314 to form a second FB.

The virtual block generation module 240 can combine the PGBs 342 of the third plane 316 of the first memory component 320 with a portion of a FB of the second memory component 330 within the lower deck of the second memory component 330 and that is on the third plane 316 to form a third FB. The upper deck portion of the FB that is on the third plane 316 of the second memory component 330 can be excluded (indicated by the X in the drawing) from being used at all. The virtual block generation module 240 can combine a portion 364 of a FB 360 of the fourth plane 318 on the upper deck portion of the first memory component 320 with a portion 374 of a FB 370 of the second memory component 330 within the lower deck of the second memory component 112N and that is on the fourth plane 318 to form a fourth FB. The lower deck portion 362 of the FB 360 that is on the fourth plane 318 of the first memory component 320 can be excluded (indicated by the X in the drawing) from being used at all. The upper deck portion 372 of the FB 370 that is on the fourth plane 318 of the second memory component 330 can be excluded (indicated by the X in the drawing) from being used at all.

In some examples, the virtual block generation module 240 can combine the first, second, third, and fourth FBs that were generated into a single VB 310.

In some examples, a second VB 390 can be formed or generated by the virtual block generation module 240 by combining different PGBs and/or portions of FBs across multiple planes and decks of multiple memory components 112A to 112N (e.g., the first memory component 320 and the second memory component 330). For example, the virtual block generation module 240 can determine that the planes 312 and 314 of the first memory component 320 include PGBs 342 on the upper deck. In such cases, the virtual block generation module 240 can determine that the lower decks of planes 312 and 314 include defective portions that cannot be accessed. In such cases, to generate a FB 394 to be used in generating a VB, the virtual block generation module 240 can combine the PGBs 342 of the upper deck of the planes 312 and 314 of the first memory component 320 with PGBs 354 (and/or portions of FBs) across the same set of planes of the upper or lower deck of the second memory component 330.

The virtual block generation module 240 can add other FBs 392 from the remaining planes (e.g., planes 316 and 318) including portions from both the upper and lower decks of the first memory component 320 and/or the second memory component 330 to form the second VB 390. Specifically, the virtual block generation module 240 can combine the FB 394 (generated by combining multiple PGBs of different memory components across the planes 312 and 314) with one or more FBs 392 of the planes 316 and 318.

Figure 4:
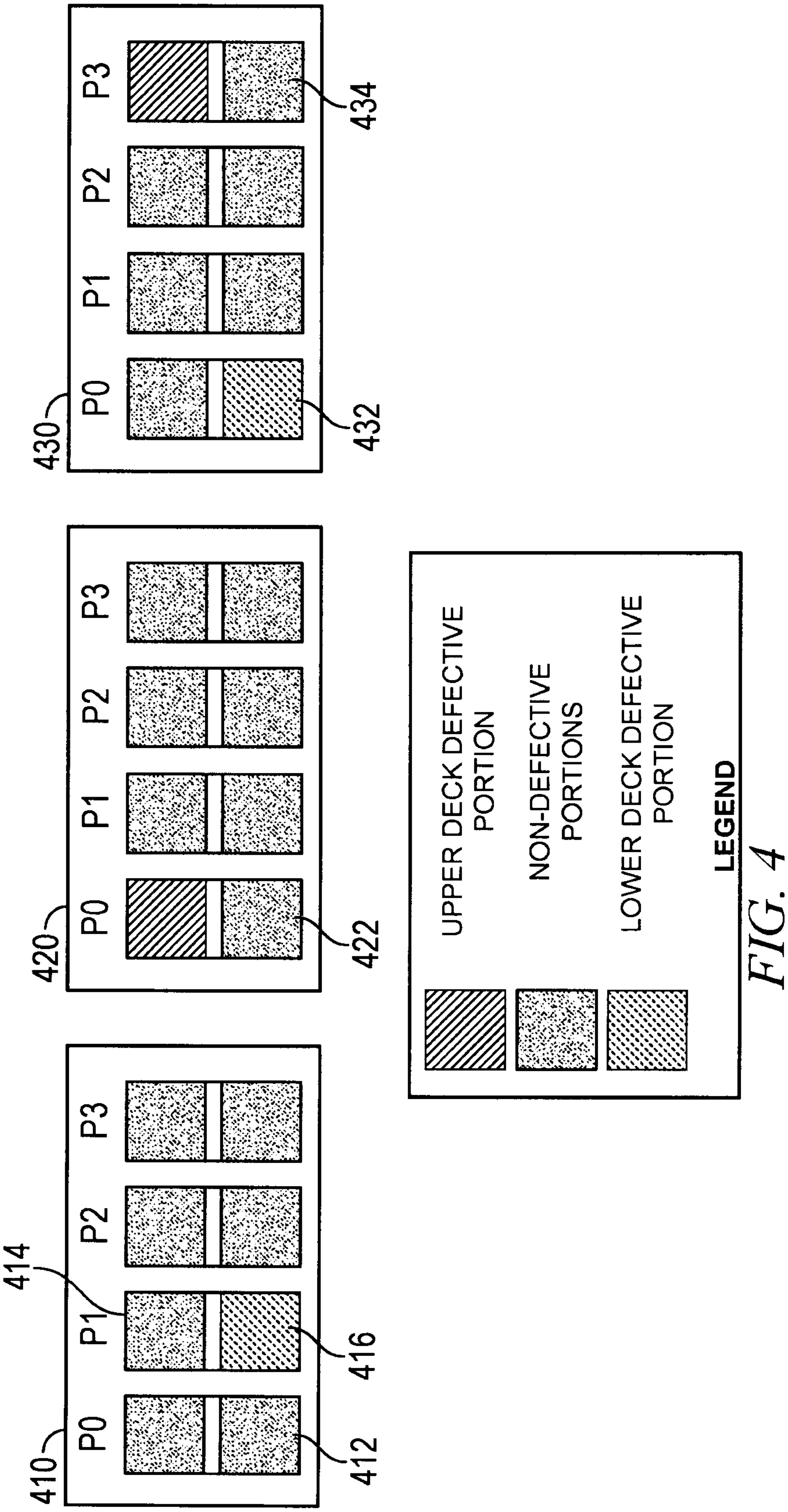

FIG. 4 is a block diagram of an example plurality of VBs 400 made up of PGBs and one or more portions of one or more FBs, in accordance with some implementations of the present disclosure. Specifically, a first VB 410 can be generated by combining multiple FBs 412 across a first set of planes (e.g., planes P0, P2, and P3) with PGBs 414 on the upper deck of an individual plane (e.g., plane P1) of the first memory component 320. The block of the first memory component 320 on the individual plane can include a defective portion 416 and a non-defective portion which makes up the PGB 414. Instead of combining the PGB 414 with an upper or lower deck of the second memory component 330, the virtual block generation module 240 can assemble, form or generate the first VB 410 using only the PGB 414 without forming a FB using the PGB 414. Namely, the first VB 410 can include FBs across less than all of the planes of the first memory component 320 where the remaining planes include only the PGBs. In such cases, a map can be stored and maintained indicating which planes of the first VB 410 have less storage than that available in a FB such as by indicating the LBAs of the plane (e.g., plane P1) that make up the PGB and/or indicating the LBAs of the plane that are inaccessible (e.g., defective portion 416).

In some cases, a second VB 420 can be generated by combining multiple FBs across a first set of planes (e.g., planes P1, P2, and P3) with PGBs 422 on the lower deck of an individual plane (e.g., plane P0) of the first memory component 320. The block of the first memory component 320 on the individual plane can include a defective portion and a non-defective portion which makes up the PGB 422. Instead of combining the PGB 422 with an upper or lower deck of the second memory component 330, the virtual block generation module 240 can assemble, form or generate the second VB 420 using only the PGB 422 without forming a FB using the PGB 422 first. Namely, the second VB 420 can include FBs across less than all of the planes of the first memory component 320 where the remaining planes include only the PGBs. In such cases, a map can be stored and maintained indicating which planes of the second VB 420 have less storage than that available in a FB such as by indicating the LBAs of the plane (e.g., plane P0) that make up the PGB and/or indicating the LBAs of the plane that are inaccessible.

In some cases, a third VB 430 can be generated by combining multiple FBs across a first set of planes (e.g., planes P1 and P2) with PGBs 432 and 434 on the upper and lower decks, respectively, of a set of planes (e.g., planes P0 and P3) of the first memory component 320. The block of the first memory component 320 on the set of planes can include a defective portion and a non-defective portion which make up the PGBs 432 and 434. Instead of combining the PGBs 432 and 434 with respective upper or lower decks of the second memory component 330, the virtual block generation module 240 can assemble, form or generate the third VB 430 using only the PGBs 432 and 434 without forming respective FBs using the PGBs 432 and 434 first. Namely, the third VB 430 can include FBs across less than all of the planes of the first memory component 320 where the remaining planes include only the PGBs. In such cases, a map can be stored and maintained indicating which planes of the second VB 420 have less storage than that available in a FB such as by indicating the LBAs of the plane (e.g., planes P0 and P3) that make up the PGBs 432 and 434 and/or indicating the LBAs of the planes that are inaccessible.

Figure 5:
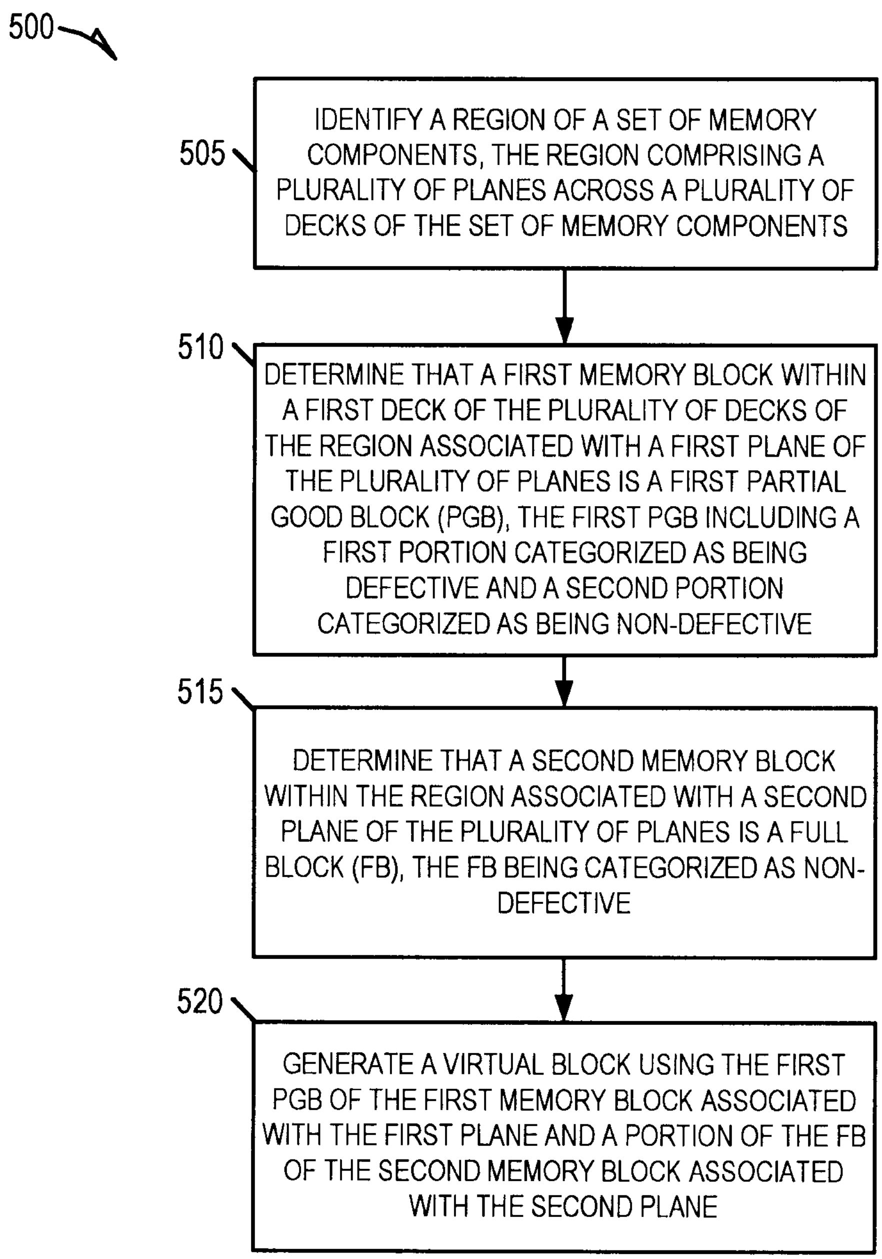
FIG. 5 is a flow diagram of example methods to perform memory operations to generate virtual blocks, in accordance with some examples of the present disclosure.

FIG. 5 is a flow diagram of an example process or method 500 to perform memory operations to generate virtual blocks from PGBs and portions of FBs, in accordance with some implementations of the present disclosure. The method 500 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some examples, the method 500 is performed by the media operations manager 122 of FIG. 1. Although the processes are shown in a particular sequence or order, unless otherwise specified, the order of the processes can be modified. Thus, the illustrated examples should be understood only as examples, and the illustrated processes can be performed in a different order, and some processes can be performed in parallel. Additionally, one or more processes can be omitted in various examples. Thus, not all processes are required in every examples. Other process flows are possible.

Referring now to FIG. 4, the method 500 begins at operation 505, with a media operations manager 122 of a memory sub-system (e.g., memory sub-system 110) identifying a region of a set of memory components, the region comprising a plurality of planes across a plurality of decks of the set of memory components. Then, at operation 510, the media operations manager 122 of the memory sub-system determines that a first memory block within a first deck of the plurality of decks of the region associated with a first plane of the plurality of planes is a first PGB, the first PGB including a first portion categorized as being defective and a second portion categorized as being non-defective. Thereafter, at operation 515, the media operations manager 122 determines that a second memory block within the region associated with a second plane of the plurality of planes is a FB, the FB being categorized as non-defective. The media operations manager 122, at operation 520, generates a virtual block using the first PGB of the first memory block associated with the first plane and a portion of the FB of the second memory block associated with the second plane.

In view of the disclosure above, various examples are set forth below. It should be noted that one or more features of an example, taken in isolation or combination, should be considered within the disclosure of this application.

Example 1. A system comprising: a set of memory components of a memory sub-system; and at least one processing device operatively coupled to the set of memory components, the at least one processing device being configured to perform operations comprising: identifying a region of the set of memory components, the region comprising a plurality of planes across a plurality of decks of the set of memory components; determining that a first memory block within a first deck of the plurality of decks of the region associated with a first plane of the plurality of planes is a first partial good block (PGB), the first PGB including a first portion categorized as being defective and a second portion categorized as being non-defective; determining that a second memory block within the region associated with a second plane of the plurality of planes is a full block (FB), the FB being categorized as non-defective; and generating a virtual block using the first PGB of the first memory block associated with the first plane and a portion of the FB of the second memory block associated with the second plane.

Example 2. The system of Example 1, wherein the virtual block is generated using less than all portions of the FB.

Example 3. The system of any one of Examples 1-2, wherein the FB is a first FB, the operations comprising: determining that a third memory block within a second deck of the plurality of decks of the region associated with the second plane is a second FB, the second FB being categorized as non-defective; and generating the virtual block by combining the portion of the first FB with another portion of the second FB.

Example 4. The system of any one of Examples 1-3, wherein the virtual block is generated using all portions of the FB within the first deck.

Example 5. The system of any one of Examples 1-4, wherein the virtual block is generated using all portions of the FB within the second deck.

Example 6. The system of any one of Examples 1-5, wherein the FB is within the first deck or within a second deck of the plurality of decks.

Example 7. The system of any one of Examples 1-6, wherein the first deck is an upper deck or lower deck of the region of the set of memory components.

Example 8. The system of any one of Examples 1-7, the operations comprising: determining that a third memory block within a second deck of the plurality of decks of the region associated with a third plane of the plurality of planes is a second PGB, the second PGB including a one portion categorized as being defective and another portion categorized as being non-defective.

Example 9. The system of Example 8, the operations comprising: generating the virtual block using the second PGB of the third memory block associated with the third plane.

Example 10. The system of any one of Examples 7-9, the operations comprising: storing a mapping table that associates logical block addresses of the virtual block with an indication that the virtual block excludes a PGB in another deck and is of a smaller size than a size of a superblock.

Example 11. The system of any one of Examples 1-10, the operations comprising: combining the first PGB and the portion of the FB with a second PGB within a second deck of the plurality of decks of the region associated with the first plane to form the virtual block.

Example 12. The system of any one of Examples 1-11, the operations comprising: storing an independent offset for each plane of the plurality of planes and for each deck of the plurality of decks, the independent offset indicating valid addresses for performing memory operations associated with memory blocks on respective planes of the plurality of planes and respective decks of the plurality of decks.

Example 13. The system of Example 12, wherein the memory operations comprise at least one of programming data to the memory blocks, reading data from the memory blocks, or performing garbage collection operations on data stored in the memory blocks.

Example 14. The system of any one of Examples 1-13, the operations comprising generating a superblock based on the virtual block across the first and second planes.

Methods and computer-readable storage medium with instructions for performing any one of the above Examples.

Figure 6:
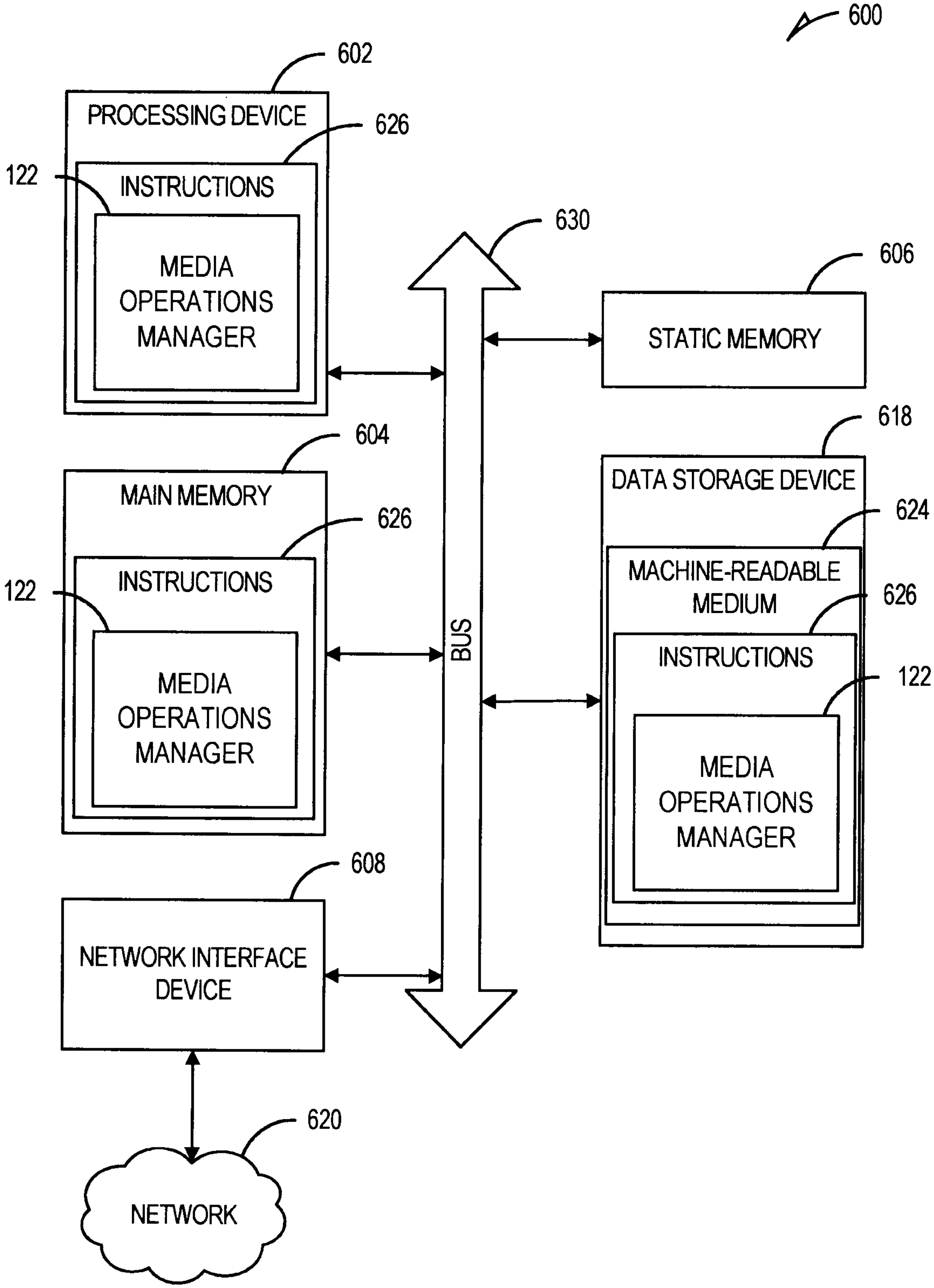
FIG. 6 is a block diagram illustrating a diagrammatic representation of a machine in the form of a computer system within which a set of instructions can be executed for causing the machine to perform any one or more of the methodologies discussed herein, in accordance with some examples of the present disclosure.

FIG. 6 illustrates an example machine in the form of a computer system 600 within which a set of instructions can be executed for causing the machine to perform any one or more of the methodologies discussed herein. In some examples, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the media operations manager 122 of FIG. 1). In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a network switch, a network bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage device 618, which communicate with each other via a bus 630.

The processing device 602 represents one or more general-purpose processing devices such as a microprocessor, a central processing unit, or the like. More particularly, the processing device 602 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), a network processor, or the like. The processing device 602 is configured to execute instructions 626 for performing the operations and steps discussed herein. The computer system 600 can further include a network interface device 608 to communicate over a network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 implement functionality corresponding to the media operations manager 122 of FIG. 1. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system's memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks; read-only memories (ROMs); random access memories (RAMs); erasable programmable read-only memories (EPROMs); EEPROMs; magnetic or optical cards; or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description above. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine-readable (e.g., computer-readable) storage medium such as a read-only memory (ROM), random access memory (RAM), magnetic disk storage media, optical storage media, flash memory components, and so forth.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:

a set of memory components of a memory sub-system; and at least one processing device operatively coupled to the set of memory components, the at least one processing device being programmed to:

identify a region of the set of memory components, the region comprising a plurality of planes across a plurality of decks of the set of memory components;

determine that a first memory block within a first deck of the plurality of decks of the region associated with a first plane of the plurality of planes is a first partial good block (PGB), the first PGB including a first portion categorized as being defective and a second portion categorized as being non-defective;

determine that a second memory block within the region associated with a second plane of the plurality of planes is a full block (FB), the FB being categorized as non-defective; and generate a virtual block using the first PGB of the first memory block associated with the first plane and a portion of the FB of the second memory block associated with the second plane.

2. The system of claim 1, wherein the virtual block is generated using less than all portions of the FB.

3. The system of claim 1, wherein the FB is a first FB, the at least one processing device being programmed to:

determine that a third memory block within a second deck of the plurality of decks of the region associated with the second plane is a second FB, the second FB being categorized as non-defective; and generate the virtual block by combining the portion of the first FB with another portion of the second FB.

4. The system of claim 1, wherein the virtual block is generated using all portions of the FB within the first deck.

5. The system of claim 1, wherein the virtual block is generated using all portions of the FB within the second deck.

6. The system of claim 1, wherein the FB is within the first deck or within a second deck of the plurality of decks.

7. The system of claim 1, wherein the first deck is an upper deck or lower deck of the region of the set of memory components.

8. The system of claim 1, the at least one processing device being programmed to:

determine that a third memory block within a second deck of the plurality of decks of the region associated with a third plane of the plurality of planes is a second PGB, the second PGB including one portion categorized as being defective and another portion categorized as being non-defective.

9. The system of claim 8, the at least one processing device being programmed to:

generate the virtual block using the second PGB of the third memory block associated with the third plane.

10. The system of claim 7, the at least one processing device being programmed to:

store a mapping table that associates logical block addresses of the virtual block with an indication that the virtual block excludes a PGB in another deck and is of a smaller size than a size of a superblock.

11. The system of claim 1, the at least one processing device being programmed to:

combine the first PGB and the portion of the FB with a second PGB within a second deck of the plurality of decks of the region associated with the first plane to form the virtual block.

12. The system of claim 1, the at least one processing device being programmed to:

store an independent offset for each plane of the plurality of planes and for each deck of the plurality of decks, the independent offset indicating valid addresses for performing memory operations associated with memory blocks on respective planes of the plurality of planes and respective decks of the plurality of decks.

13. The system of claim 12, wherein the memory operations comprise at least one of programming data to the memory blocks, reading data from the memory blocks, or performing garbage collection operations on data stored in the memory blocks.

14. The system of claim 1, the at least one processing device being programmed to generate a superblock based on the virtual block across the first and second planes.

15. A method comprising:

identifying a region of a set of memory components, the region comprising a plurality of planes across a plurality of decks of the set of memory components;

determining that a first memory block within a first deck of the plurality of decks of the region associated with a first plane of the plurality of planes is a first partial good block (PGB), the first PGB including a first portion categorized as being defective and a second portion categorized as being non-defective;

determining that a second memory block within the region associated with a second plane of the plurality of planes is a full block (FB), the FB being categorized as non-defective; and generating a virtual block using the first PGB of the first memory block associated with the first plane and a portion of the FB of the second memory block associated with the second plane.

16. The method of claim 15, wherein the FB is a first FB, comprising:

determining that a third memory block within a second deck of the plurality of decks of the region associated with the second plane is a second FB, the second FB being categorized as non-defective; and generating the virtual block by combining the portion of the first FB with another portion of the second FB.

17. The method of claim 15, wherein the virtual block is generated using all portions of the FB within the first deck.

18. A non-transitory computer-readable storage medium comprising instructions that, when executed by at least one processing device, cause the at least one processing device to perform operations comprising:

identifying a region of a set of memory components, the region comprising a plurality of planes across a plurality of decks of the set of memory components;

determining that a first memory block within a first deck of the plurality of decks of the region associated with a first plane of the plurality of planes is a first partial good block (PGB), the first PGB including a first portion categorized as being defective and a second portion categorized as being non-defective;

determining that a second memory block within the region associated with a second plane of the plurality of planes is a full block (FB), the FB being categorized as non-defective; and generating a virtual block using the first PGB of the first memory block associated with the first plane and a portion of the FB of the second memory block associated with the second plane.

19. The non-transitory computer-readable storage medium of claim 18, wherein the FB is a first FB, the operations comprising:

determining that a third memory block within a second deck of the plurality of decks of the region associated with the second plane is a second FB, the second FB being categorized as non-defective; and generating the virtual block by combining the portion of the first FB with another portion of the second FB.

20. The non-transitory computer-readable storage medium of claim 18, wherein the virtual block is generated using all portions of the FB within the first deck.

* * * * *